(12) United States Patent
Fujiwara et al.

(10) Patent No.: US 10,767,085 B2
(45) Date of Patent: Sep. 8, 2020

(54) SEMICONDUCTOR-BONDING RESIN COMPOSITION, SEMICONDUCTOR-BONDING SHEET, AND SEMICONDUCTOR DEVICE USING SEMICONDUCTOR-BONDING SHEET

(71) Applicant: KYOCERA Corporation, Kyoto-shi, Kyoto (JP)

(72) Inventors: Masakazu Fujiwara, Warabi (JP); Hiroshi Fukukawa, Kawaguchi (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 16/406,124

(22) Filed: May 8, 2019

(65) Prior Publication Data

US 2019/0264071 A1 Aug. 29, 2019

Related U.S. Application Data

(63) Continuation of application No. PCT/JP2016/083349, filed on Nov. 10, 2016.

(51) Int. Cl.
*H01L 23/48* (2006.01)
*H01L 23/52* (2006.01)
(Continued)

(52) U.S. Cl.
CPC . *C09J 9/02* (2013.01); *C09J 7/38* (2018.01); *C09J 11/04* (2013.01); *C09J 179/04* (2013.01);
(Continued)

(58) Field of Classification Search
CPC ... H01L 2224/83851; H01L 2924/0665; H01L 2924/07811; H01L 21/76829;
(Continued)

(56) References Cited

U.S. PATENT DOCUMENTS

2011/0247865 A1* 10/2011 Tsurumi .............. H05K 3/4661
174/255
2012/0114927 A1 5/2012 Khaselev et al.
(Continued)

FOREIGN PATENT DOCUMENTS

JP 09-053001 A 2/1997
JP 2005-044524 A 2/2005
(Continued)

*Primary Examiner* — S. V. Clark
(74) *Attorney, Agent, or Firm* — Volpe and Koenig, P.C.

(57) ABSTRACT

There is provided a semiconductor-bonding resin composition having excellent thermally conductive property and electrically conductive property and suitable for joining a power semiconductor element and an element support member. There are provided: a semiconductor-bonding resin composition containing (A) a bismaleimide resin including an aliphatic hydrocarbon group on a main chain, (B) a curing agent, (C) a filler containing electrically conductive particles having a specific gravity of 1.1 to 5.0, and (D) silver microparticles having an average particle size of 10 to 300 nm; a semiconductor-bonding sheet obtained using the semiconductor-bonding resin composition; and a semiconductor device including a semiconductor joined by the semiconductor-bonding sheet.

10 Claims, 1 Drawing Sheet

(51) Int. Cl.
*H01L 29/40* (2006.01)
*C09J 9/02* (2006.01)
*C09J 7/38* (2018.01)
*H01L 23/00* (2006.01)
*H01B 1/22* (2006.01)
*C09J 179/04* (2006.01)
*H01L 21/52* (2006.01)
*C09J 11/04* (2006.01)

(52) U.S. Cl.
CPC .............. *H01B 1/22* (2013.01); *H01L 21/52* (2013.01); *H01L 24/29* (2013.01); *H01L 24/83* (2013.01); *C09J 2203/326* (2013.01); *C09J 2205/102* (2013.01); *C09J 2400/16* (2013.01); *C09J 2479/08* (2013.01); *H01L 2224/2919* (2013.01); *H01L 2224/29339* (2013.01); *H01L 2224/29393* (2013.01); *H01L 2224/83851* (2013.01); *H01L 2924/07025* (2013.01)

(58) Field of Classification Search
CPC ... H01L 2224/8385; H01L 2224/83856; H01L 33/56
USPC .................................................. 257/782, 783
See application file for complete search history.

(56) References Cited

U.S. PATENT DOCUMENTS

| | | |
|---|---|---|
| 2013/0256894 A1 | 10/2013 | Adema |
| 2013/0306916 A1 | 11/2013 | Gao et al. |
| 2015/0195921 A1* | 7/2015 | Onodera ............ C09K 19/3087 174/258 |
| 2016/0286653 A1* | 9/2016 | Mori ....................... C09J 169/00 |
| 2017/0025374 A1* | 1/2017 | Fujiwara .................. C09J 11/04 |
| 2019/0369812 A1* | 12/2019 | Narita ..................... B32B 15/08 |

FOREIGN PATENT DOCUMENTS

| | | |
|---|---|---|
| JP | 2005-109160 A | 4/2005 |
| JP | 2007-217693 A | 8/2007 |
| JP | 2009-295688 A | 12/2009 |
| JP | 2014-503936 A | 2/2014 |
| JP | 2014-194013 A | 10/2014 |
| WO | 2012/118061 A1 | 9/2012 |
| WO | 2015/151136 A1 | 10/2015 |
| WO | 2016/116959 A1 | 7/2016 |

* cited by examiner

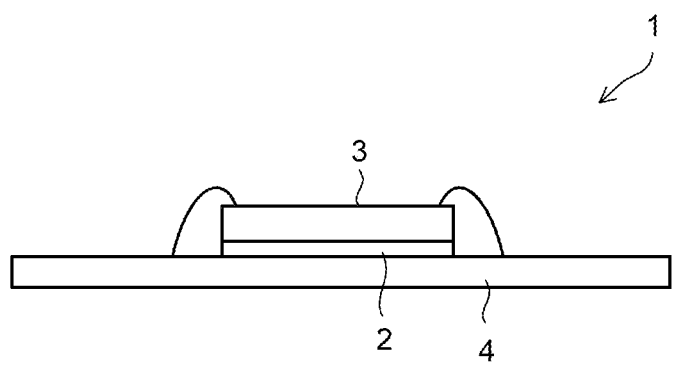

SEMICONDUCTOR-BONDING RESIN COMPOSITION, SEMICONDUCTOR-BONDING SHEET, AND SEMICONDUCTOR DEVICE USING SEMICONDUCTOR-BONDING SHEET

CROSS-REFERENCE TO RELATED APPLICATIONS

This application is a continuation of prior International Application No. PCT/JP2016/083349, filed on Nov. 10, 2016; the entire contents of all of which are incorporated herein by reference.

FIELD

This disclosure relates to a semiconductor-bonding resin composition, a semiconductor-bonding sheet, and a semiconductor device, and in more particularly to a semiconductor-bonding resin composition capable of forming a baked type bonding sheet optimal for joining a power semiconductor element and a substrate, a semiconductor-bonding sheet, and a semiconductor device.

BACKGROUND

In recent years, a semiconductor device for power is getting more widely used not only for general industrial use and electric railroad use but also for on-vehicle use as environment consciousness increases. In particular, reduction in size and weight of each of on-vehicle parts in a limited allowable size is directly linked to the performance of the vehicle, and therefore on-vehicle parts tend to be decreased in size also for a semiconductor device for power.

Such a semiconductor device has a semiconductor element for power mounted, for example, on a die pad of a DBC (Direct Bonded Copper: registered trademark) via a high-lead solder high in heat resistance.

However, the use of harmful substance containing lead comes to be restricted, and making lead-free is demanded. Hence, as a lead-free jointing material high in heat resistance other than the high-lead solder, a joining method using sintered-type silver paste of joining a silver filler of a nano-order at a temperature of a melting point or lower is under review. The sintered-type silver paste is high in thermal conduction and is effective for joining the semiconductor element for power handling large current.

For example, there are suggested a method for joining a semiconductor element and a DBC substrate by a porous metallic film (refer to US-A1 2013/0256894) and a method for transferring film-shaped silver paste formed by pre-drying printed silver paste to a semiconductor element and then joining it to a DBC substrate (refer to JP-A 2014-503936).

SUMMARY

This disclosure is a sintered-type semiconductor-bonding sheet capable of exhibiting excellent thermally conductive property and electrically conductive property and joining a power semiconductor element and an element support member. Further, this disclosure is a semiconductor-bonding resin composition capable of forming the semiconductor-bonding sheet and a semiconductor device using the semiconductor-bonding sheet.

The semiconductor-bonding resin composition of this disclosure contains: (A) a bismaleimide resin including an aliphatic hydrocarbon group on a main chain; (B) a curing agent; (C) a filler containing electrically conductive particles having a specific gravity of 1.1 to 5.0; and (D) silver microparticles having an average particle size of 10 to 300 nm.

Further, the semiconductor-bonding sheet of this disclosure is a sheet-shaped molded body including the semiconductor-bonding resin composition of this disclosure.

Further, the semiconductor device of this disclosure includes a semiconductor element joined on a support member via the semiconductor-bonding sheet of this disclosure.

The semiconductor-bonding resin composition of this disclosure is an adhesive material capable of exhibiting excellent thermally conductive property and electrically conductive property. Further, it is possible to reduce the settling of particles also in applying and drying the semiconductor-bonding resin composition of this disclosure diluted with a solvent for molding it into a sheet shape, so that a sinterable bonding sheet can be obtained.

The semiconductor-bonding sheet of this disclosure can exhibit excellent thermally conductive property and electrically conductive property, and can join a semiconductor element or a power semiconductor element on a support member.

Furthermore, the semiconductor-bonding sheet does not cause any fillet in mounting the semiconductor element and therefore can reduce the size of the semiconductor device as compared with high-lead paste and sintered-type silver paste with fillet.

The semiconductor device of this disclosure has a semiconductor element joined on a support member while having excellent thermally conductive property and electrically conductive property, and can efficiently and stably perform an operation.

BRIEF DESCRIPTION OF DRAWING

FIG. 1 is a side view of a semiconductor device being an embodiment.

DETAILED DESCRIPTION

This disclosure relates to a semiconductor-bonding resin composition capable of forming a baked type bonding sheet, a semiconductor-bonding sheet, and a semiconductor device.

The semiconductor-bonding resin composition of this disclosure contains, as described above, (A) a bismaleimide resin including an aliphatic hydrocarbon group on a main chain thereof; (B) a curing agent; (C) a filler containing electrically conductive particles having a specific gravity of 1.1 to 5.0; and (D) silver microparticles having an average particle size of 10 to 300 nm.

The component (A) used in this disclosure is a bismaleimide resin having an aliphatic hydrocarbon group on a main chain thereof, and the main chain linking two maleimide groups has an aliphatic hydrocarbon group with one or more carbons. Here, the aliphatic hydrocarbon group may have any one of straight-chained, branch-chained, and cyclic forms.

In one embodiment, the number of carbons is six or more. In another embodiment, the number of carbons is 12 or more. In still another embodiment, the number of carbons is 24 or more.

Further, it is preferable that the aliphatic hydrocarbon group is directly combined to the maleimide group.

By containing the bismaleimide resin, a semiconductor-bonding resin composition superior in heat resistance, low in stress, and excellent in thermal-time bonding strength after moisture absorption is obtained.

As the component (A), an imide-extended bismaleimide compound (A1) expressed by the following general formula (1) can be exemplified.

[Chem. 1]

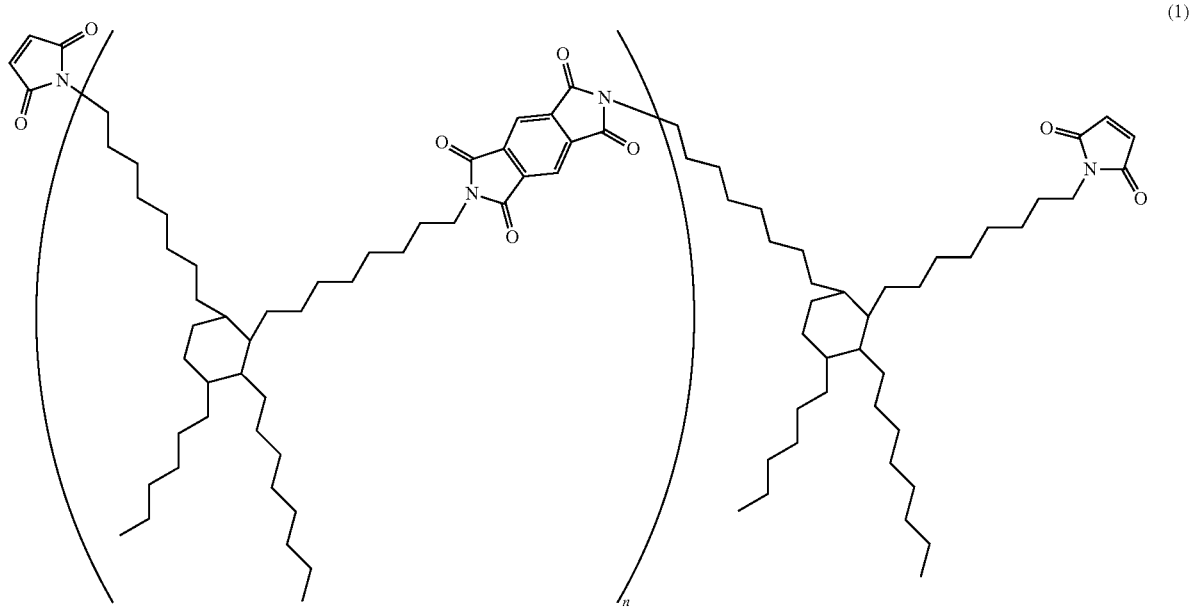

(1)

where n is an integer of 1 to 10.

Examples of the bismaleimide compound (A1) include BMI-3000 (manufactured by Designer Molecules Inc., brand name; molecular weight 3000) and BMI-5000 (manufactured by Designer Molecules Inc., brand name; molecular weight 5000) and the like.

In an embodiment, the bismaleimide compound (A1) has a polystyrene-equivalent number-average molecular weight of 500 or more and 5000 or less. In another embodiment, the bismaleimide compound (A1) has a polystyrene-equivalent number-average molecular weight of 1000 or more and 3000 or less. If the number-average molecular weight is less than 500, the heat resistance tends to lower, whereas if exceeds 5000, the temporary fitting property in manufacture of a semiconductor device tends to lower.

Further, as the component (A), a bismaleimide compound (A2) expressed by the following general formula (2) can be exemplified.

[Chem. 2]

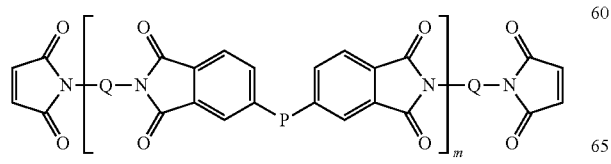

(2)

where Q represents a bivalent straight-chained, branch-chained, or cyclic aliphatic hydrocarbon group with 6 or more carbons, P represents a bivalent atom or organic group and a group containing at least one or more bivalent atoms or organic groups selected from O, CO, COO, $CH_2$, $C(CH_3)_2$, $C(CF_3)_2$, S, $S_2$, SO, and $SO_2$, and m represents an integer of 1 to 10. Here, the group represented by Q may have 6 to 44 carbons. Examples of the bivalent atom represented by P include O, S, and the like, and examples of the bivalent organic group include CO, COO, $CH_2$, $C(CH_3)_2$, $C(CF_3)_2$, $S_2$, SO, $SO_2$, and the like, and an organic group containing at least one or more of these atoms or organic groups. Examples of the organic group containing the aforementioned atom or organic group include, other than the above structure, those having a hydrocarbon group with 1 to 3 carbons, a benzene ring, a cyclo ring, a urethane bond and the like, and examples of P in this case include groups expressed by the following chemical formulas.

[Chem. 3]

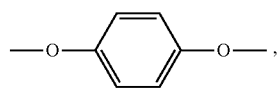

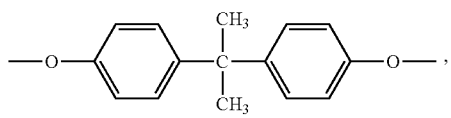

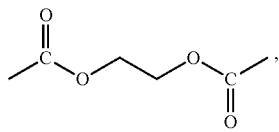

-continued

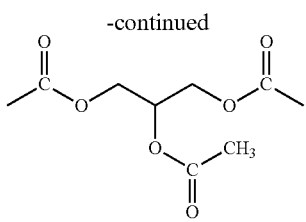

Examples of the bismaleimide compound (A2) include BMI-1500 (manufactured by Designer Molecules Inc., brand name; molecular weight 1500) and the like.

One kind of the component (A) may be used alone or a mixture of two or more kinds may be used. As the compounding ratio of the component (A) is higher, a semiconductor-bonding resin composition superior in post-moisture absorption thermal-time adhesion strength is obtained. Note that by compounding the component (A1), a semiconductor-bonding resin composition excellent in sheet formability can be obtained. Besides, by compounding the component (A2), a semiconductor-bonding resin composition excellent in following capability can be obtained.

Further, the semiconductor-bonding resin composition of this disclosure may be made by using the bismaleimide compound (A1) and the bismaleimide compound (A2) in combination when mixing two or more kinds of the component (A).

In an embodiment, when using the bismaleimide chemical compounds (A1) and (A2) in combination, the compounding ratio of the component (A1) to the component (A2) is ranging from 5/95 to 30/70 on a mass basis. When the (A1) is 5 or more in the above ratio, the formability of the sheet shape improves. When the (A1) is 30 or less, the temporary fitting property becomes excellent. In short, when the compounding ratio of the component (A1) to the component (A2) is within the above range, a semiconductor-bonding resin composition easy in sheet formation and excellent in temporary fitting property can be obtained.

The (B) curing agent used in this disclosure is not particularly limited as long as it is a polymerization catalyst generally used for radical polymerization.

In an embodiment, the polymerization catalyst is a peroxide. In another embodiment, the peroxide is an organic peroxide. In still another embodiment, the organic peroxide is the one which generates radicals by heating at 120° C. or lower.

Examples of the organic peroxide being the component (B) include t-butylperoxy-2-ethylhexanoate, benzoyl peroxide, t-butyl peroxide, acetyl peroxide, methyl ethyl ketone peroxide, acyl component peroxide, cumene peroxide and the like.

This curing agent being the (B) may be used alone or a combination of two or more kinds may be used.

Further, the content of the component (B) is 0.1 to 10 parts by mass and preferably 0.2 to 5 parts by mass per 100 parts by mass of the component (A) from the viewpoints of curability and storage stability.

The (C) filler used in this disclosure contains electrically conductive particles having a specific gravity of 1.1 to 5.0. As this electrically conductive particle, the specific gravity is 1.1 to 4.0.

When the specific gravity of the (C) filler is within this range, the settling of the filler is reduced in preparing the resin composition, in forming a sheet and the like, so that a bonding sheet in which the filler is uniformly dispersed in a thickness direction of the sheet can be obtained.

When the specific gravity of the (C) filler is less than 1.1, the content percentage of the conductive metal is low, possibly failing to perform sufficient baking. When the specific gravity of the (C) filler is over 5.0, the filler being the component (C) settles out and is unevenly distributed on the lower side in applying the resin composition, possibly failing to obtain sufficient thermally conductive property and electrical conductivity.

In an embodiment, the (C) filler is, for example, a spherical metal powder such as a spherical aluminum powder.

In another embodiment, the (C) filler is a metal-coated powder having a powdery metal oxide such as spherical silica powder, spherical alumina powder, spherical titania powder or the like as a nucleus with its surface being coated with a conductive metal.

In still another embodiment, the (C) filler is a metal-coated powder having a heat-resistant resin particle as a nucleus with its surface being coated with a conductive metal or the like.

In the case of the metal-coated powder, the content percentage of the coating conductive metal is 10 to 60 mass %. When the content percentage of the conductive metal is within this range, a filler having excellent thermal conductivity and electrically conductive property even with a low specific gravity can be obtained.

In an embodiment, the coating conductive metal is gold or silver.

In another embodiment, the (C) filler is silver-coated particles made by silver coating the surface of spherical silica with a silver content percentage of 10 to 60 mass %.

By highly filling gold- or silver-coated spherical silica, a semiconductor-bonding resin composition having excellent thermal conductivity and electrically conductive property can be obtained.

When using the silver-coated particles made by silver coating the surface of spherical silica with a silver content percentage of 10 to 60 mass %, a semiconductor-bonding resin composition having a small difference in linear expansion coefficient from a semiconductor element is obtained.

In this disclosure, in an embodiment, the particle size of the (C) filler has a volume average particle size $D_{50}$ by the laser diffraction scattering mode particle size distribution measurement method of 1 to 10 μm. In another embodiment, the aspect ratio defined by (maximum major axis of particle/width orthogonal to maximum major axis) is 1.0 to 1.2.

By using the spherical particles having an aspect ratio falling within this range, a network excellent in electrically conductive property in a thickness direction of the sheet is formed, thereby improving the thermally conductive property and electrical conductivity. Further, when the aspect ratio falls within the aforementioned range, it becomes easy to uniformly coat the particle surfaces with the conductive metal, thus making it hard to cause peeling, cracks and the like of the coating conductive metal.

Note that the (C) filler does not contain later-described (D) silver microparticles and (F) nanocarbons.

The (D) silver microparticles used in this disclosure are particles having an average particle size of 10 to 300 nm. As the shape of the (D) silver microparticles, any of a spherical shape, a scaly shape, a plate shape, a needle shape, a rod shape and the like can be used, and the shape is not particularly limited. The average particle size of other than the spherical particle means the minor axis.

Note that this average particle size is calculated by the arithmetic average of a particle size for 100 samples randomly extracted and measured by a transmission electron microscope (TEM) or a scanning electron microscope (SEM).

The silver microparticle may have a surface coated with an organic compound having, as a component, nitrogen, carbon, oxygen and having a molecular weight of 20000 or less, specifically, an organic compound containing a functional group such as a carboxyl group, an amino group or the like. By coating the surface with the organic compound, the aggregation of silver microparticles is reduced and dispersibility thereof is improved.

The organic compound containing the carboxyl group used here may be one or more kinds of organic compounds selected from organic carboxylic acids having a molecular weight of 110 to 20000.

Examples thereof include carboxylic acids such as hexanoic acid, heptanoic acid, octanoic acid, nonanoic acid, decanoic acid, undecanoic acid, dodecanoic acid, tetradecanoic acid, eicosanoic acid, docosanoic acid, 2-ethylhexanoic acid, oleic acid, linolic acid, linolenic acid, and dipropionic acid-terminated polyethylene oxide. Further, as the organic compound, carboxylic acid derivatives of the aforementioned carboxylic acids are also usable.

Further, examples of the organic compound containing the amino group used here include alkylamine and the like.

Examples thereof include: primary amines such as butylamine, methoxyethylamine, 2-ethoxyethylamine, hexylamine, octylamine, 3-butoxypropylamine, nonylamine, dodecylamine, hexadodecylamine, octadecylamine, cocoamine, tallow amine, tallow amine hydroxide, oleylamine, laurylamine, stearylamine, and 3-aminopropyltriethoxysilane; secondary amines such as dicocoamine, dihydrogenated tallow amine, and distearylamine; tertiary amines such as dodecyldimethylamine, didodecylmonomethylamine, tetradecyldimethylamine, octadecyldimethylamine, cocodimethylamine, dodecyl tetradecyldimethylamine, and trioctylamine; and besides, diamines such as naphthalenediamine, stearylpropylenediamine, octamethylenediamine, nonandiamine, diamine-terminated polyethylene oxide, triamine-terminated polypropylene oxide, and diamine-terminated polypropylene oxide.

When the molecular weight of the organic compound covering the silver microparticles is over 20000, the organic compound is difficult to remove from the metal particle surfaces. When the organic compound is difficult to remove from the metal particle surfaces, the organic compound possibly remains in the cured product when the bonding sheet is baked. When the organic compound remains in the baked bonding sheet, the thermally conductive property and the electrically conductive property may deteriorate as a result. Further, the molecular weight of the organic compound is preferably 50 or more. If the molecular weight is less than 50, the organic compound may be poor in storage stability for the silver microparticles.

Accordingly, from the above viewpoint, the molecular weight of the organic compound covering the surfaces is preferably as small as possible within a range capable of ensuring the storage stability.

In the spherical silver microparticles, a mass ratio between the silver microparticles and the organic compound covering or dispersing them is preferably 90:10 to 99.5:0.5.

If the mass ratio of the organic compound to the silver microparticles is less than 99.5:0.5, the silver microparticles may aggregate.

If the mass ratio of the organic compound to the silver microparticles is more than 90:10, the organic compound possibly remains in the cured product after baking, resulting in deterioration in electrically conductive property.

In this disclosure, in an embodiment, when the total amount of the component (C) and the component (D) is 100, a mass ratio of the component: (C) the component (D) is 10:90 to 90:10. In another embodiment, the mass ratio of the component (C):the component (D) is 50:50 to 90:10.

If the component (D) is too less with respect to the component (C), it may be difficult to ensure high thermally conductive property. If the component (D) is too much, a void may occur in the cured product, thereby deteriorating the thermally conductive property and the electrically conductive property.

Here, the filler being the component (C) and the silver microparticles being the component (D) are compounded so that the total amount of them is 40 to 80 mass % of the whole resin composition. When the total of the component (C) and the component (D) is less than 4 mass %, the thermally conductive property and the electrically conductive property may not be obtained, whereas when more than 80 mass %, they may not function as a resin composition.

The semiconductor-bonding resin composition of this disclosure includes the filler being the component (C) having a specific range of the specific gravity and the silver microparticles being the component (D) having a specific particle size and thereby can reduce the settling of the particles even in the case of dilution with a solvent for application and dry on a carrier sheet.

Further, this resin composition can accelerate sintering between the filler being the component (C) and the silver microparticles being the component (D) and thus can exhibit excellent thermally conductive property and electrically conductive property.

The semiconductor-bonding resin composition of this disclosure contains the above components (A) to (D) and may contain other components as follows.

To the semiconductor-bonding resin composition of this disclosure, an organic substance as (E) a flux component may be added. The flux component mentioned here means the one having a flux activity of removing an oxide coating film of a support member for joining the semiconductor element.

Examples of the (E) flux component include carboxylic acids. The carboxylic acid may be either an aliphatic carboxylic acid or an aromatic carboxylic acid.

Examples of the aliphatic carboxylic acid include malonic acid, methylmalonic acid, dimethylmalonic acid, ethylmalonic acid, allylmalonic acid, 2,2'-thiodiacetic acid, 3,3'-thiodipropionic acid, 2,2'-(ethylenedithio)diacetic acid, 3,3'-dithiopropionic acid, 2-ethyl-2-hydroxybutyric acid, dithiodiglycolic acid, diglycolic acid, acetylenedicarboxylic acid, maleic acid, malic acid, 2-isopropylmalic acid, tartaric acid, itaconic acid, 1,3-acetonedicarboxylic acid, tricarballylic acid, muconic acid, β-hydromuconic acid, succinic acid, methylsuccinic acid, dimethylsuccinic acid, glutaric acid, α-ketoglutaric acid, 2-methylglutaric acid, 3-methylglutaric acid, 2,2-dimethylglutaric acid, 3,3 -dimethylglutaric acid, 2,2-bis(hydroxymethyl)propionic acid, citric acid, adipic acid, 3-t-butyladipic acid, pimelic acid, phenyloxalic acid, phenylacetic acid, nitrophenylacetic acid, phenoxyacetic acid, nitrophenoxyacetic acid, phenylthioacetic acid, hydroxyphenylacetic acid, dihydroxyphenylacetic acid, mandelic acid, hydroxymandelic acid, dihydroxymandelic acid, 1,2,3,4-butanetetracarboxylic acid, suberic acid, 4,4'-dithiodibutyric acid, cinnamic acid, nitrocinnamic acid, hydroxycinnamic acid, dihydroxycinnamic acid, coumaric acid, phenylpyruvic acid, hydroxyphenylpyruvic acid, caffeic acid, homophthalic acid, tolylacetic acid, phenoxypropionic acid, hydroxyphenylpropionic acid, benzyloxyacetic acid, phenyllactic acid, tropic acid, 3-(phenylsulfonyl)propionic acid, 3,3-tetramethyleneglutaric acid, 5-oxoazelaic acid, azelaic acid, phenylsuccinic acid, 1,2-phenylenediacetic acid, 1,3-phenylenediacetic acid, 1,4-phenylenediacetic acid, benzylmalonic acid, sebacic acid, dodecanoic diacid, undecanoic diacid, diphenylacetic acid, benzilic acid, dicyclohexylacetic acid, tetradecane diacid, 2,2-diphenylpropionic acid, 3,3-diphenylpropionic acid, 4,4-bis(4-hydroxyphenyl)valeric acid, pimaric acid, palustric acid, isopimaric acid, abietic acid, dehydroabietic acid, neoabietic acid, and agathic acid.

Examples of the aromatic carboxylic acid include benzoic acid, 2-hydroxybenzoic acid, 3-hydroxybenzoic acid, 4-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 2,3,4-trihydroxybenzoic acid, 2,4,6-trihydroxybenzoic acid, 3,4,5-trihydroxybenzoic acid, 1,2,3-benzenetricarboxylic acid, 1,2,4-benzenetricarboxylic acid, 1,3,5-benzenetricarboxylic acid, 2-[bis(4-hydroxypheny)methyl]benzoic acid, 1-naphthoic acid, 2-naphthoic acid, 1-hydroxy-2-naphthoic acid, 2-hydroxy-l-naphthoic acid, 3-hydroxy-2-naphthoic acid, 6-hydroxy-2-naphthoic acid, 1,4-dihydroxy-2-naphthoic acid, 3,5-dihydroxy-2-naphthoic acid, 3,7-dihydroxy-2-naphthoic acid, 2,3-naphthalenedicarboxylic acid, 2,6-naphthalenedicarboxylic acid, 2-phenoxybenzoic acid, biphenyl-4-carboxylic acid, biphenyl-2-carboxylic acid, and 2-benzoylbenzoic acid.

Among them, in view of storage stability and easy availability, it is adoptable to use, as the (E) flux component, succinic acid, malic acid, itaconic acid, 2,2-bis(hydroxymethyl)propionic acid, adipic acid, 3,3'-thiodipropionic acid, 3,3'-dithiopropionic acid, 1,2,3,4-butanetetracarboxylic acid, suberic acid, sebacic acid, phenylsuccinic acid, dodecanoic diacid, diphenylacetic acid, benzilic acid, 4,4-bis(4-hydroxyphenyl)valeric acid, abietic acid, 2,5-dihydroxybenzoic acid, 3,4,5-trihydroxybenzoic acid, 1,2,4-benzenetricarboxylic acid, 1,3,5-benzenetricarboxylic acid, 2-[bis(4-hydroxyphenyl)methyl]benzoic acid, or the like. Each of these compounds may be used alone, or a combination of two or more kinds of them may be used.

In an embodiment of this disclosure, the (E) flux component is a dicarboxylic acid.

In another embodiment, the (E) flux component has a decomposition temperature of 100 to 300° C. In still another embodiment, the (E) flux component has a decomposition temperature of 150 to 290° C.

By compounding the dicarboxylic acid, simultaneously with not only removal of the oxide coating film of the joining support member but also removal of an oxide coating film and silver oxide of the component (C) and the component (D) by an exchange reaction at the time of joining heating, the dicarboxylic acid itself decomposes or evaporates the surface treatment agent (stearic acid, palmitic acid, hexanoic acid, oleic acid, or the like) existing on the surface, and thus never obstructing the later sintering of the silvers. Thus, silvers are sintered at a lower temperature than that before the addition.

If the decomposition temperature of the (E) flux component is lower than 100° C., its volatility is high even at room temperature and accordingly is likely to cause a decrease in reducing power due to the evaporation of a dispersion medium, possibly failing to obtain stable adhesion strength.

Besides, if the decomposition temperature of the (E) flux component is over 300° C., the sintering of the conductive film is difficult to occur, and thus the film lacks denseness, and the flux component does not evaporate but may remain in the film.

The content of the (E) flux component is preferably 0.01 to 5 parts by mass to 100 parts by mass of the total of the component (C) and the component (D)t.

If the content of the (E) flux component is over 5 parts by mass, a void may occur to have an adverse effect on reliability.

The content of the (E) flux component of less than 0.01 parts by mass is not preferable because the flux activity may not function.

In this disclosure, (F) nanocarbons may further be contained.

Examples thereof include carbon nanotube (monolayer, doublelayer, multilayer types, cup stack type), carbon nanofiber and so on.

The "nanocarbon" means a fine carbon having a size of 1000 nm or less at least at one side in the shape of its material.

Among the nanocarbons, the carbon nanotube is preferable because the fibrous projections become tentacles so that the silver particles are preferably connected together via ceramic particles to improve the thermal conductivity.

The carbon nanotube may be either a single-wall carbon nanotube or a multi-wall carbon nanotube.

In an embodiment, an average fiber length of the carbon nanotubes is 0.1 to 100 µm. In another embodiment, the average fiber length is 0.1 to 50 µm. In still another embodiment, the average fiber length is 0.1 to 20 µm.

Further, in an embodiment, an average fiber diameter of the carbon nanotubes is 5 to 200 nm. In another embodiment, the average fiber diameter is 8 to 160 nm. In still another embodiment, the average fiber diameter is 9 to 120 nm.

Further, the (F) nanocarbons may be ceramic particles obtained by sintering to dispersedly contain nanocarbons. The method for manufacturing the ceramic particles containing nanocarbons in a dispersion state is not particularly limited as long as it can obtain ceramic raw material particles dispersedly containing nanocarbons.

For example, a method of compounding a predetermined amount of nanocarbons and ceramic raw material particles in a solvent to form slurry and drying it and then sintering it can be exemplified. Note that in this event, the ceramic raw material particles are formed such that part of nanocarbons project from the ceramic surfaces of the particles.

In the case where the (F) nanocarbons are the ceramic particles obtained by sintering to dispersedly contain nanocarbons, the ceramic particles may be particles having a size of an average particle size of 1 to 10 µm. The average particle size here means a 50% integrated value ($D_{50}$) in the particle size distribution obtained on a volume base by the laser diffraction scattering mode particle size distribution measurement method.

By containing the (F) nanocarbons, the nanocarbons twin around a network of the silver particles formed in the sheet-like resin composition, whereby a resin composition excellent in thermally conductive property and electrically conductive property can be obtained.

The compounding amount of the component (F) may be 5 mass % or less of the whole resin composition. When the compounding amount of the component (F) is over 5 mass %, the viscosity increases and may deteriorate the workability. In the case of using the ceramic particles, the compounding amount of the component (F) is the amount of only the nanocarbons contained therein.

The semiconductor-bonding resin composition of this disclosure may further contain (G) a (meth)acrylic acid ester compound or (meth)acrylamide compound having a hydroxyl group. By containing the hydroxyl group, the sinterability by reduction is accelerated and bonding property is improved.

The component (G) here may have the (meth)acrylic acid ester compound or (meth)acrylamide compound as a basic skeleton and a substituent having an aliphatic hydrocarbon group with 4 to 100 carbons. The hydroxyl group is contained as an alcoholic group in which a hydrogen atom of an aliphatic hydrocarbon group is substituted.

In an embodiment of this disclosure, the content of this hydroxyl group is 1 to 50 groups in one molecule. When the content of the hydroxyl group is within this range, sinterability is not hindered by excessive curing.

The compounding amount of the component (G) is preferably 1 to 20 parts by mass to 100 parts by mass of the total amount of the filler being the component (C) and the silver microparticles being the component (D). By setting the above compounding range, excellent adhesive strength can be obtained in joining the semiconductor element onto the element support member.

If the compounding amount of the component (G) is over 20 parts by mass, the content of resin in the cured product layer increases and thereby may decrease the thermal conductivity characteristics and the specific resistance.

If the compounding amount of the component (G) is less than 1 part by mass, the adhesive strength may decrease.

The semiconductor-bonding resin composition of this disclosure may further contain (H) a coupling agent. The coupling agent is not particularly limited and its examples include 3-methacryloxypropyltrimethoxysilane, 3-acryloxypropyltrimethoxysilane, vinyltrimethoxysilane, vinyltriethoxysilane, vinyltris(β-methoxyethoxy)silane, β-(3,4-epoxycyclohexyl)ethyltrimethoxysilane, 3-glycidoxypropyltrimethoxysilane, 3-glycidoxypropylmethyldiethoxysilane, 3-aminopropyltriethoxysilane, N-phenyl-3-aminopropyltrimethoxysilane, 3-mercaptopropyltrimethoxysilane, titanate-based coupling agent, aluminum-based coupling agent, zirconate-based coupling agent, zircoaluminate-based coupling agent and so on.

In an embodiment, the compounding amount of the coupling agent being the component (H) is within a range of 0.01 to 5 mass % to the whole resin composition. In another embodiment, the compounding amount of the component (H) is within a range of 0.05 to 4 mass %.

If the compounding amount of the component (H) is less than 0.01 mass %, sufficient adhesiveness may not be obtained.

If the compounding amount of the component (H) is over 5 mass %, a bleeding phenomenon may occur in applying paste.

In the resin composition of this disclosure, besides the above components, a curing accelerator, a stress reducing agent such as rubber or silicone, a coupling agent, a defoaming agent, a surface active agent, a coloring agent (pigment, dye), various kinds of polymerization inhibitors, oxidation inhibitors, and other various kinds of additives which are generally compounded in this kind of composition can be compounded as required.

One kind of these additives may be used alone or a mixture of two or more kinds of them may be used.

Examples of such additives include silane coupling agents such as epoxysilane, mercaptosilane, aminosilane, alkylsilane, clade silane, vinylsilane, and sulfide silane, coupling agents such as a titanate coupling agent, an aluminum coupling agent, and an aluminum/zirconium coupling agent, coloring agents such as carbon black, solid stress reducing components such as silicone oil and silicone rubber, and inorganic ion exchangers such as hydrotalcite.

The semiconductor-bonding resin composition of this disclosure can be manufactured using a publicly-known method. The semiconductor-bonding resin composition of this disclosure can be obtained, for example, by kneading the above-described components (A) to (D) and various components compounded as required using a publicly-known kneader such as a pot mill, a ball mill, a bead mill, a roll mill, a homogenizer, a supermill, a mortar grinder or the like under room temperature or heating, and then diluting it with solvent as needed.

The semiconductor-bonding sheet of this disclosure is obtained by forming the semiconductor-bonding resin composition into a sheet-shaped molded body. The semiconductor-bonding sheet is excellent in joining property between the semiconductor and the support member and can exhibit excellent electrically conductive property and thermally conductive property, particularly, by joining by sintering.

A method for manufacturing the semiconductor-bonding sheet of this disclosure is as follows.

First, the semiconductor-bonding resin composition obtained by diluting with solvent as described above is adjusted in viscosity to about 0.5 to 2 Pa·s.

Then, the above semiconductor-bonding resin composition is obtained by being applied onto a supporting film by a publicly-known method and dried.

More specifically, the semiconductor-bonding sheet is obtained by applying the semiconductor-bonding resin composition onto the supporting film by a publicly-known coating method such as a bar coating method, a knife coating method, a roll coating method, a blade coating method, a die coating method, or a gravure coating method, and dry-treating it into a semi-cured state.

As the supporting film, a plastic film such as polyethylene, polypropylene, polyester, polycarbonate, polyarylate, polyacrylonitrile or the like provided with a releasing agent layer on one surface is used.

In an embodiment, the thickness of the supporting film is generally 10 to 50 μm in view of handling property. In another embodiment, it is 25 to 38 μm.

The thickness after drying of the adhesive layer of the semiconductor-bonding sheet obtained by the above method is 5 to 50 μm in an embodiment.

In another embodiment, the thickness of the adhesive layer after drying is 10 to 30 μm.

The semiconductor device of this disclosure is made by joining the semiconductor element onto the support member such as a substrate using the above-described semiconductor-bonding sheet. In other words, the semiconductor-bonding sheet is used here as a thermally conductive and electrically conductive die attach sheet. FIG. 1 is a side view illustrating a schematic configuration of the semiconductor device being an embodiment. A semiconductor device 1 being the embodiment is made by joining a semiconductor element 3 onto a support member 4 using a semiconductor-bonding sheet 2 as described above.

The semiconductor device of this disclosure can be manufactured as follows in an embodiment.

First, the semiconductor-bonding sheet is temporarily fitted to a joining surface or the like of a silicon chip under conditions of a temperature of 50 to 80° C., a pressure of 0.1 to 1 MPa, and a heating and pressurizing time of 0.1 to 1 minute.

Then, the silicon chip to which the semiconductor-bonding sheet is temporarily fitted is mounted on the support member such as a copper frame, and then heated and pressurized under conditions of a temperature of 80° C. to 200° C., a pressure of 0.1 to 5 MPa, and a heating and pressurizing time of 0.1 to 1 minute and thereby pressure-bonded.

Further, the mounted silicon chip is heated and cured at a temperature of 200 to 250° C. for 0.5 to 2 hours, whereby a semiconductor device can be manufactured.

Here, examples of the semiconductor element include publicly-known semiconductor elements such as a transistor, a diode, and a light-emitting element, and in particular, a power semiconductor element such as a silicon carbide (SiC) device can be exemplified. Further, examples of the support member include copper, silver-plated copper, PPF (pre-plated lead frame), glass epoxy, ceramics, DBS substrate and the like.

The semiconductor device obtained as described above is joined onto the support member with the semiconductor-bonding sheet having excellent thermally conductive property and electrically conductive property and is thus voidless and formed with no fillet, and therefore has no squeeze-out of an adhesive onto the side surface of the semiconductor element, which is effective in downsizing. Further, the semiconductor device obtained as described above is excellent also in connection reliability with respect to a temperature cycle after mounting.

EXAMPLES

Manufacturing Example 1

<Preparation of Spherical Silver-Coated Silica Particle>

For the spherical silver-coated silica particles, spherical palladium-adhered base material particles in which palladium as a catalyst core is made to adhere to spherical silica are formed first.

Then, nickel particles are made to adhere to the surfaces of the spherical palladium-adhered base material particles, and then spherical nickel-coated base material particles having a nickel coating film being a base layer of the silver plating formed on the surfaces are formed.

Finally, by performing silver plating on the surfaces of the spherical nickel-coated base material particles, the spherical silver-coated silica particles are obtained. Hereinafter, it is explained in detail.

The spherical palladium-adhered base material particles were formed by etching through alkaline degreasing and acid neutralizing 10 g of spherical silica particles (manufactured by TATSUMORI LTD., brand name: US-5) having a volume average particle size $D_{50}$ of 3.5 μm, and washing them and then adding them into a palladium dichloride solution, and stirring them.

The spherical nickel particle-adhered base material particles are formed by first stirring the above spherical palladium-adhered base material particles in 300 ml of deionized water for three minutes and adding 1 g of metal nickel particle slurry (manufactured by MITSUI MINING & SMELTING CO.,LTD., brand name: 2020SUS) and precipitating nickel on the spherical palladium-adhered base material particle surfaces using the palladium on the spherical palladium-adhered base material particle surfaces as catalyst cores.

The spherical nickel-coated base material particles are formed by diluting the above nickel particle-adhered base material particles with 1000 mL of distilled water, adding 4 mL of plating stabilizer and stirring them, and further gradually adding 150 mL of a mixed solution of 400 g/L of nickel sulfate, 100 g/L of sodium hypophosphite, 100 g/L of sodium citrate, and 6 mL of plating stabilizer to the mixed solution while stirring the them.

The spherical silver-coated silica particles were formed by putting the above spherical nickel-coated base material particles into an electroless silver plating solution prepared by mixing and dissolving 30 g of succinimide and 4 g of citric acid into a solution made by mixing 5 g of silver nitrate, 1200 mL of distilled water, and 10 g of benzimidazole, and further adding 10 g of glyoxylic acid.

The spherical silver-coated silica particles were subjected to heating and stirring at 80° C. and electroless silver plating, and then washing, and the silver-coated particles substituted by alcohol were dried to obtain the spherical silver-coated silica particles. The obtained silver-coated silica particles had an aspect ratio of 1.01, a specific surface area of 1.5 m²/g, a volume average particle size $D_{50}$=3.8 μm, a volume average particle size ratio $D_{50}/D_{10}$=1.8, a maximum particle size of 19 μm, a specific gravity of 2.8, and a silver coated amount of 27.3 mass %.

Examples 1 to 3, Comparative Examples 1 to 4>

The resin composition of this disclosure was prepared by sufficiently mixing components at a compounding ratio listed in Table 1 and kneading them by three rolls. Then, the resin composition was prepared to have a solid content of 40 mass % by adding propylene glycol monomethyl ether (PGM) and methyl ethyl ketone as a solvent.

The obtained resin composition was applied and dried on a polypropylene film having a thickness of 40 μm by a roll coater into a thickness after drying of 15 μm, whereby a semiconductor-bonding sheet was obtained.

component (A)

(A1): a solid bismaleimide resin having an aliphatic hydrocarbon group on its main chain (manufactured by Designer Molecules Inc., brand name: BMI-5000; number average molecular weight 5000)

(A2): a liquid bismaleimide resin having an aliphatic hydrocarbon group on its main chain (manufactured by Designer Molecules Inc., brand name: BMI-1500; number average molecular weight 1500)

component (B): dicumyl peroxide (manufactured by NOF Corporation, brand name: PERCUMYL D)

component (C): the spherical silver-coated silica particles in Manufacturing example 1 (average particle size: 3.8 μm, specific gravity: 2.8)

Other filler: silver particles (manufactured by Fukuda Metal Powder and Foil Co., Ltd., brand name: AgC-212D; average particle size: 5 μm, specific gravity: 10.5)

component (D)

(D1): plate-shaped silver microparticles (manufactured by Tokusen Kogyo Co., Ltd., brand name: M13; median particle size: 2 μm, thickness: 50 nm or less)

(D2): spherical silver microparticles (manufactured by Mitsuboshi Belting Ltd., brand name: MDot; average particle size: 50 nm)

component (E): malic acid component (F): carbon nanotube (manufactured by Showa Denko K.K., brand name: VGCF; average fiber diameter: 80 nm, average fiber length: 10 μm)

component (G): hydroxyethylacrylamide (manufactured by Kohjin Co., Ltd., brand name: HEAA)

component (H): glycidoxyoctyltrimethoxysilane (manufactured by Shin-Etsu Chemical Co., Ltd., brand name: KBM-4803).

<Evaluation Method>

[Handlability]

The evaluation of the handlability of the semiconductor-bonding sheet was carried out by bending the obtained semiconductor-bonding sheet 180 degrees and based on the following standards.

A: no crack and no peeling from film
B: no peeling from film but abnormal external appearance
C: crack or peeling from film occurred

[Temporary Fitting Property]

The evaluation of the temporary fitting property of the semiconductor-bonding sheet was carried out such that when the semiconductor-bonding sheet was temporarily fitted to a 6 mm×6 mm silicon chip and to a chip with a gold rear surface having a joint surface provided with a gold deposition layer under the following conditions, the case of capable of bonding was determined as "A" and the case of incapable of bonding was determined as "B".

The dimensions of the silicon chip were set to 6 mm×6 mm.

The pressure bonding was performed under the temporary fitting conditions of the semiconductor-bonding sheet of 65° C., 1 second, and a pressure of 1 MPa.

[Thermal-time Adhesion Strength]

The evaluation of the temporary fitting property of the semiconductor-bonding sheet was carried out by curing and performing a moisture absorption treatment on a sample piece, and then measuring the thermal-time die shear strength at 260° C. using a mounting strength measuring device.

The conditions of the moisture absorption treatment were set to 85° C., a relative humidity of 85%, and 72 hours.

The sample piece was produced by temporarily fitting the semiconductor-bonding sheet to a silicon chip and a chip with a gold rear surface having a joint surface provided with a gold deposition layer and then mounting them on a solid copper frame and a PPF (Ni—Pd/Au plated copper frame), and heating and pressurizing bonding them at 125° C., for 5 seconds, and at a pressure of 0.1 MPa and curing them in an oven at 220° C.

The dimensions of the silicon chip were set to 6 mm×6 mm.

The pressure bonding was performed under the temporary fitting conditions of the semiconductor-bonding sheet of 65° C., 1 second, and a pressure of 1 MPa.

[Thermal Conductivity]

For the thermal conductivity of the semiconductor-bonding sheet, the thermal conductivity of the cured product was measured by a laser flash method according to JIS R 1611-1997.

[Electrical Resistance]

For the electrical resistance of the semiconductor-bonding sheet, measurement was performed on the sample piece by a four-terminal method, using "MCP-T600" (brand name, manufactured by Mitsubishi Chemical Corporation).

The sample piece was produced by bonding the semiconductor-bonding sheet to a glass substrate (thickness of 1 mm) under the conditions of 65° C., 1 second, and a pressure of 1 MPa, and cured at 200° C. for 60 minutes.

[Package-Crack Resistance]

The sample piece was made by mounting a silicon chip on a copper frame and PPF via the semiconductor-bonding sheet, heating and curing it on a hot plate at 200° C., for 60 seconds, and at a pressure of 2.5 MPa or heating and curing it using an oven at 200° C., for 60 minutes, and at a pressure of 2.5 MPa, and then molding it under the following conditions using an epoxy sealing material (brand name: KE-G3000D) manufactured by KYOCERA Corporation.

The detailed sample production conditions are as follows:
dimensions of the silicon chip: 6 mm×6 mm
package: 80 pQFP (14 mm×20 mm×2 mm thick)
chip: a silicon chip and a chip with a gold rear surface
lead frame: PPF and copper
molding of sealing material: 175° C., 2 minutes
post-mold cure: 175° C., 8 hours (1) IR Reflow Resistance For the evaluation of the package-crack resistance of the semiconductor-bonding sheet, a sample piece subjected to a moisture absorption treatment at 85° C., at a relative humidity of 85%, for 168 hours was subjected to an IR reflow treatment (260° C., 10 seconds), and the number of internal cracks occurred in the package was observed under an ultrasonic microscope.

The evaluation result in Table 1 indicates the number of samples in which cracks occurred, for five samples.

(2) Thermal Shock Resistance

For the evaluation of the thermal shock resistance of the semiconductor-bonding sheet, the above sample pieces were used and subjected to a thermal cycle treatment, and the number of internal cracks occurred in each package after each of the treatments was observed under the ultrasonic microscope.

The condition of the thermal cycle treatment was 1000 cycles of the operation of increasing the temperature from −55° C. to 150° C. and cooling to −55° C. as one cycle.

The evaluation result in Table 1 indicates the number of samples in which the cracks occurred for five samples.

[Void Ratio]

For the evaluation of the void ratio of the semiconductor-bonding sheet, a solder junction was observed from a direction vertical to a joint surface by an X-ray transmission apparatus (brand name: SMX-1000, manufactured by Shimadzu Corporation, a microfocus X-ray inspection device), a void area and a joint part area were found and the void ratio was calculated by the following expression.

Void ratio (%)=void area÷(void area+joint part area)×100

A void ratio of less than 5% was evaluated as "A", a void ratio of 5% or more and less than 8% was evaluated as "B", and a void ratio of 8% or more was evaluated as "C".

The results of the evaluation of the characteristics are listed in Table 1 together with the compositions of the semiconductor-bonding resin compositions.

TABLE 1

| | | | Example | | | Comparative example |
| --- | --- | --- | --- | --- | --- | --- |
| | | | 1 | 2 | 3 | 1 |
| Compounding composition (parts by mass) | Component (A) | (A1) solid bismaleimide resin | 5 | 5 | 5 | 5 |
| | | (A2) liquid bismaleimide resin | 10 | 10 | 10 | 10 |
| | Component (B) | Curing agent | 0.1 | 0.1 | 0.1 | 0.1 |
| | Component (C) | Filler | 75 | 75 | 75 | |
| | Other filler | | | | | 75 |
| | Component (D) | (D1) spherical silver microparticles | 10 | | 10 | |
| | | (D2) plate-shaped silver microparticles | | 10 | | |
| | Component (E) | Flux | 0.01 | 0.01 | 0.01 | 0.01 |
| | Component (F) | Nanocarbons | 0.5 | 0.5 | 0.5 | 0.5 |
| | Component (G) | Acrylic resin | 0.5 | 0.5 | | 0.5 |
| | Component (H) | Coupling agent | 0.1 | 0.1 | 0.1 | 0.1 |

TABLE 1-continued

|  |  |  |  |  |  |  |  |
|---|---|---|---|---|---|---|---|
| Cured product characteristics | Handlability |  |  | A | A | A | A |
|  | Temporary fitting property |  |  | A | A | A | A |
|  | Thermal conductivity [W/(m · k)] |  |  | 98 | 98 | 72 | 1 |
|  | Electrical resistance [Ω] |  |  | 4.00E−06 | 4.00E−06 | 6.00E−06 | 8.00E−04 |
|  | Thermal-time adhesion strength [N/chip] | PPF | Normal state | 27 | 27 | 20 | 5 |
|  |  |  | After moisture absorption treatment | 27 | 27 | 20 | 5 |
|  |  | Copper frame | Normal state | 22 | 22 | 15 | 3 |
|  |  |  | After moisture absorption treatment | 22 | 22 | 15 | 3 |
|  | Package-crack resistance [number of cracks occurred] | PPF | After IR reflow | 0 | 0 | 0 | 5 |
|  |  |  | After thermal 1000-cycle treatment | 0 | 0 | 0 | 5 |
|  |  | Copper frame | After IR reflow | 0 | 0 | 0 | 5 |
|  |  |  | After thermal 1000-cycle treatment | 0 | 0 | 0 | 5 |
|  | Void ratio |  |  | A | A | A | A |

|  |  |  | Comparative example |  |  |
|---|---|---|---|---|---|
|  |  |  | 2 | 3 | 4 |
| Compounding composition (parts by mass) | Component (A) | (A1) solid bismaleimide resin | 5 | 5 | 5 |
|  |  | (A2) liquid bismaleimide resin | 10 | 10 | 10 |
|  | Component (B) | Curing agent | 0.1 | 0.1 | 0.1 |
|  | Component (C) | Filler |  | 75 |  |
|  | Other filler |  | 75 |  | 75 |
|  | Component (D) | (D1) spherical silver microparticles |  |  | 10 |
|  |  | (D2) plate-shaped silver microparticles | 10 |  |  |
|  | Component (E) | Flux | 0.01 | 0.01 | 0.01 |
|  | Component (F) | Nanocarbons | 0.5 | 0.5 | 0.5 |
|  | Component (G) | Acrylic resin | 0.5 | 0.5 | 0.5 |
|  | Component (H) | Coupling agent | 0.1 | 0.1 | 0.1 |
| Cured product characteristics | Handlability |  | A | A | A |
|  | Temporary fitting property |  | A | A | A |
|  | Thermal conductivity [W/(m · k)] |  | 2 | 15 | 2 |
|  | Electrical resistance [Ω] |  | 8.00E−04 | 9.00E−06 | 8.00E−04 |
|  | Thermal-time adhesion strength [N/chip] | PPF | Normal state | 10 | 12 | 5 |
|  |  |  | After moisture absorption treatment | 10 | 12 | 5 |
|  |  | Copper frame | Normal state | 8 | 10 | 3 |
|  |  |  | After moisture absorption treatment | 8 | 10 | 3 |
|  | Package-crack resistance [number of cracks occurred] | PPF | After IR reflow | 5 | 0 | 5 |
|  |  |  | After thermal 1000-cycle treatment | 5 | 3 | 5 |
|  |  | Copper frame | After IR reflow | 5 | 0 | 5 |
|  |  |  | After thermal 1000-cycle treatment | 5 | 3 | 5 |
|  | Void ratio |  | C | A | C |

It was found from the above that a resin composition useful as an adhesive material capable of exhibiting excellent thermally conductive property and electrically conductive property can be obtained. Accordingly, in a semiconductor device in which a semiconductor element is bonded on a support member with the resin composition, the semiconductor element can be joined to the support member while having excellent thermally conductive property and electrically conductive property and causing no fillet. Thus, the resin composition of this disclosure is excellent for semiconductor bonding (particularly, for power semiconductor bonding), and use of it can provide a semiconductor device improved in efficiency and increased in reliability.

What is claimed is:
1. A semiconductor-bonding sheet being a sheet-shaped molded body made of a semiconductor-bonding resin composition, the semiconductor-bonding resin composition containing:
    (A) a bismaleimide resin having an aliphatic hydrocarbon group on a main chain;
    (B) a curing agent;
    (C) a filler containing electrically conductive particles having a specific gravity of 1.1 to 5.0; and
    (D) silver microparticles having an average particle size of 10 to 300 nm.

2. The semiconductor-bonding sheet according to claim 1, wherein the component (A) contains a bismaleimide compound (A1) expressed by the following general formula (1),

[Chem. 1]

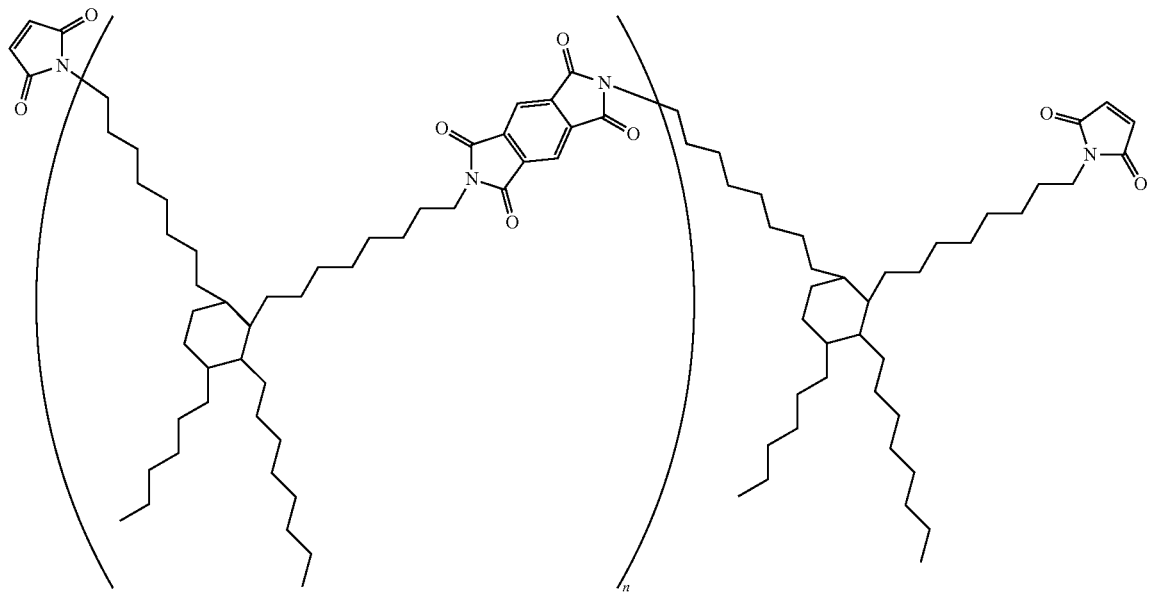

(1)

where n represents an integer of 1 to 10.

3. The semiconductor-bonding sheet according to claim 1, wherein the component (A) contains a bismaleimide compound (A2) expressed by the following general formula (2),

[Chem. 2]

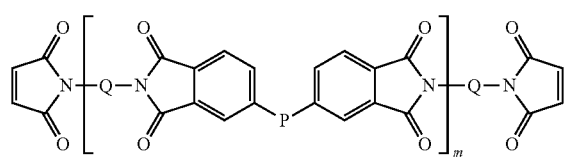

(2)

where, Q represents a bivalent straight-chained, branch-chained, or cyclic aliphatic hydrocarbon group with 6 or more carbons, P represents a bivalent atom or organic group selected from O, CO, COO, $CH_2$, $C(CH_3)_2$, $C(CF_3)_2$, S, $S_2$, SO, and $SO_2$ or an organic group containing at least one or more of the atoms or organic groups, and m represents an integer of 1 to 10.

4. The semiconductor-bonding sheet according to claim 3, wherein the component (A1) and the component (A2) are contained at a ratio of the component (A1) to the component (A2) ranging from 5/95 to 30/70 on a mass basis.

5. The semiconductor-bonding sheet according to claim 1, wherein the component (C) is silver-coated particles at a silver content percentage of 10 to 60 mass %.

6. The semiconductor-bonding sheet according to claim 1, wherein the component (C) is silver-coated silica particles.

7. The semiconductor-bonding sheet according to claim 1, wherein:
   a content of the component (B) is 0.1 to 10 parts by mass per 100 parts by mass of the resin being the component (A); and
   a total of contents of the component (C) and the component (D) is 40 to 80 mass % of the whole resin composition and a mass ratio of the component (C) and the component (D) is 10:90 to 90:10.

8. The semiconductor-bonding sheet according to claim 1, further containing (E) a flux component.

9. The semiconductor-bonding sheet according to claim 1, further containing (F) nanocarbons.

10. A semiconductor device comprising a semiconductor element joined on a support member via the semiconductor-bonding sheet according to claim 1.

* * * * *